United States Patent [19]
Nishiura et al.

[11] Patent Number: 5,675,181
[45] Date of Patent: Oct. 7, 1997

[54] ZIRCONIA-ADDED ALUMINA SUBSTRATE WITH DIRECT BONDING OF COPPER

[75] Inventors: Masaharu Nishiura; Shigemasa Saito; Akira Morozumi; Shizuyasu Yosida; Katumi Yamada, all of Kawasaki; Toshio Nozaki, Mine; Hiroshi Miyama, Mine; Seigo Oiwa, Mine; Kazuya Matuura, Mine; Kazuhiko Teramura, Mine, all of Japan

[73] Assignees: Fuji Electric Co., Ltd., Kanagawa; Sumitomo Metal Ceramics Inc., Yamaguchi, both of Japan

[21] Appl. No.: 588,680

[22] Filed: Jan. 19, 1996

Related U.S. Application Data

[63] Continuation-in-part of Ser. No. 375,105, Jan. 19, 1995, abandoned.

[30] Foreign Application Priority Data

Jan. 19, 1995 [JP] Japan .................. 7-006103

[51] Int. Cl.⁶ .................. H01L 23/053; H01L 23/06; H01L 23/10; H01L 23/34
[52] U.S. Cl. .................. 257/701; 257/705; 257/706; 257/714
[58] Field of Search .................. 257/701, 705, 257/706, 788, 789, 687, 693, 712, 714

[56] References Cited

U.S. PATENT DOCUMENTS

| | | | |
|---|---|---|---|
| 3,994,430 | 11/1976 | Cusano et al. | 257/787 |
| 4,316,964 | 2/1982 | Lange | 501/105 |
| 4,331,048 | 5/1982 | Dworak et al. | 407/119 |
| 4,497,875 | 2/1985 | Arakawa et al. | 428/620 |
| 4,536,435 | 8/1985 | Utsumi et al. | 428/209 |
| 4,540,462 | 9/1985 | Mizunoya et al. | 156/630 |
| 4,745,457 | 5/1988 | Morgan | 357/80 |
| 5,185,215 | 2/1993 | Adams, Jr. et al. | 428/545 |
| 5,304,518 | 4/1994 | Sunahara et al. | 501/62 |

FOREIGN PATENT DOCUMENTS

| | | | |
|---|---|---|---|
| 0 119 028 | 9/1983 | European Pat. Off. | |
| 0 727 818 | 8/1996 | European Pat. Off. | |
| 3728096 | 1/1989 | Germany | |
| 56-5374 | 1/1981 | Japan | |
| 59-190259 | 10/1984 | Japan | |
| 62-132766 | 6/1987 | Japan | |
| 63-015430 | 1/1988 | Japan | H01L 21/56 |
| 2-149464 | 6/1990 | Japan | |
| 3-029349 | 2/1991 | Japan | |
| 3-145748 | 6/1991 | Japan | |
| 6-13481 | 1/1994 | Japan | |
| 7-038014 | 2/1995 | Japan | |
| WO 88/03917 | 6/1988 | WIPO | H01L 21/48 |

Primary Examiner—Mahshid D. Saadat
Assistant Examiner—Jhihan B. Clark
Attorney, Agent, or Firm—Finnegan, Henderson, Farabow, Garrett & Dunner, L.L.P.

[57] ABSTRACT

A ceramic substrate is a high-temperature fired body consisting of alumina as the main component, zirconia, and a ceramics sintering assisting agent. The assisting agent is one of yttria, calcia, magnesia, and ceria, in which yttria is added at 0.1–2 wt %, calcia is added at 0.02–0.5 wt %, magnesia is added at 0.02–0.4 wt %, and ceria is added at 0.02–0.5 wt %.

14 Claims, 11 Drawing Sheets

ZIRCONIA-ADDED ALUMINA SUBSTRATE WITH DIRECT BONDING OF COPPER

This is a continuation-in-part of application Ser. No. 08/375,105, filed Jan. 19, 1995 now abandoned.

BACKGROUND OF THE INVENTION

1. Field of the Invention

The present invention relates to an insulating substrate on which a semiconductor chip is mounted by, for instance, soldering to constitute a semiconductor device such as a power transistor module and, more specifically, to a bonded substrate (CBC substrate: ceramic bonding copper) in which thin copper plates are directly bonded to a ceramic substrate (insulating core plate).

2. Description of the Related Art

For example, as shown in FIG. 1, a power transistor module has a bonded substrate (CBC substrate) 2 that is fixed to a radiation metal base 1 by, for instance, soldering; a semiconductor chip 3 such as an IGBT (insulated-gate bipolar transistor) mounted on the substrate 2; a plurality of lead-out terminals 4 whose bent tip portions are connected, by soldering, to a copper plate 2c assuming a circuit pattern which constitutes the front (upper) surface of the CBC substrate 2; a terminal block 7 to which the lead-out terminals 4 are secured; bonding wires 5 that connect the semiconductor chip 3 to the copper plate 2c; a gel-like resin 9 that fills an internal space formed by the radiation metal base 1 and a resin case 6 which are fixed to each other with an adhesive, for instance; and a sealing resin 8 that seals the resin case 6. The CBC substrate 2 is of a type produced by directly bonding thin, copper plates 2b and 2c to the back (lower) and front (upper) surfaces of a ceramic substrate (insulating core plate) 2a by a direct-bonding-of-copper method, in which bonding is effected by using, as a bonding agent, a copper-copper oxide eutectic liquid phase formed by a reaction between copper and a very small amount of oxygen. The ceramic substrate 2a is made of alumina ($Al_2O_3$) or aluminum nitride (AlN). The copper plate 2c on the fundamental surface side (upper side) is shaped into a circuit pattern (thick-film circuit pattern).

When, as described above, the CBC substrate 2 is used as a thick-film circuit substrate on which the power semiconductor chip 3 of, for instance, a power transistor module is mounted, the following problems will occur.

(1) A large amount of heat generated in the semiconductor chip 3 (such as a power transistor) during a current-conducting operation is conducted to the metal base 1 via the CBC substrate 2, and radiated outward from the metal base 1. Therefore, the heat conductivity of the CBC substrate 2 is an important factor of determining the current capacity of the semiconductor device.

However, the heat conductivity of the CBC substrate 2 is relatively low, because the CBC substrate 2 has a laminate structure in which the copper plates 2b and 2c are bonded to the ceramic substrate 2a, an insulating base material (core material). Heat conductivities of alumina and aluminum nitride, which are used as a material of the ceramic substrate 2a, are compared as follows:

alumina: 21 W/K·m
aluminum nitride: 180 W/K·m

Although aluminum nitride is much superior to alumina in heat conductivity, the material cost of the former is higher than that of the latter.

Under the above-described circumstances, to improve the radiation performance with the use of the ceramic substrate made of an inexpensive alumina material, the present inventors have tried to reduce its resistance of heat conduction by making it as thin as possible. However, it has been found that if the thickness of the ceramic substrate made of an alumina material is reduced to, for instance, about 0.3 mm, its actual strength (i.e., resistance to impact) is lowered. As a result, when the semiconductor chip (silicon) 3 is bonded to the copper plate 2c, a difference between thermal expansion coefficients of the respective materials causes heat-originating failures. Thermal expansion coefficients of the above respective materials are listed below:

silicon (semiconductor chip): $4.0 \times 10^{-6}/°C$.
alumina: $7.5 \times 10^{-6}/°C$.
copper: $18.0 \times 10^{-6}/°C$.

(2) The bonding between the copper plates 2b and 2c and the ceramic substrate 2a causes stress in an end portion 2d (not shown) of the copper plate 2c facing the ceramic substrate 2a, which may cause a crack in the ceramic substrate 2a when it is subjected to a heat cycle. This results from a difference between thermal expansion coefficients of the ceramic substrate 2a and the copper plate 2c. To solve the above edge cracking problem, Japanese Unexamined Patent Publication No. Hei. 3-145748 discloses a structure as shown in FIGS. 2A and 2B in which in the case of a CBC substrate using a 0.64-mm-thick ceramic (alumina) substrate 2a and copper substrates 2b and 2c of 0.3–0.5 mm in thickness, a groove 10 is formed in each of the copper plates 2b and 2c so as to have a depth of ½ to ⅔ of its thickness and a width of ⅔ of its thickness, and to be spaced from its perimeter by a distance x=0.3–0.5 mm, which is approximately equal to its thickness. Since the groove 10 reduces the degree of stress concentration, the edge cracking in the ceramic substrate 2a can be prevented. However, the groove 10 that is formed along the perimeter of the copper plate 2c makes its peripheral region a dead space, reducing an area actually available for mounting of a semiconductor chip. In particular, as the area of each section of the patterned copper plate 2c becomes smaller, the ratio of reduction of the available area becomes larger. This becomes an obstruction in reducing the area of the CBC substrate 2, and therefore in miniaturizing a semiconductor device.

SUMMARY OF THE INVENTION

The present invention has been made in view of the above problems, and has an object of providing a ceramic substrate for a semiconductor device which substrate is mainly made of a low-cost alumina powder. The ceramic substrate can be made thinner to improve its radiation performance without decreasing its mechanical strength, particularly the fracture toughness (flexibility) by optimizing the material composition.

To attain the above object, according to the invention, there is provided a substrate for a semiconductor device comprising:

a ceramic substrate that is a high-temperature-fired body and has a material composition including alumina as the main component and zirconia; and a copper plate directly bonded to the ceramic substrate.

It is preferred that the material composition of the ceramic substrate be such that the content of alumina is 70–90 wt % and the content of zirconia is 10–30 wt %.

To assist sintering of ceramics and improve the toughness of zirconia crystal grains, the ceramic substrate may include, in addition to alumina and zirconia, at least one of yttria, calcia, magnesia and ceria that is each added at a ratio of 0.5–2 wt % (the resulting mixture is fired). Alternatively, zirconia that is stabilized totally or partially by forming solid solution-with at least one of yttria, calcia, magnesia, and ceria may be added to alumina. More specifically, zirconia and at least one of the above additives are pulverized and mixed together in a material state and fired in the air at 1,300°–1,400° C. The resulting mixture and alumina are mixed together and fired again at 1,550°–1,600° C. Existing in alumina matrix as fine particles of solid solution, the additive(s) improves the toughness of zirconia and prevents occurrence of cracks.

According to another aspect of the invention, there is provided a substrate for a semiconductor device, comprising:

a ceramic substrate that is a ceramic fired body and has a material composition including alumina as the main component, zirconia, and at least one ceramics sintering. assisting agent selected from the group consisting of yttria, calcia, magnesia, and ceria; and thin copper plates directly bonded to front and back surfaces of the ceramic substrate, respectively.

It is preferred that alumina have a weight proportion that is not less than 70% and less than 100%, zirconia have a weight proportion that is more than 0% and not more than 30%, and the at least one assisting agent have a total weight proportion of 0.02% to 2%. More specifically, where the assisting agent is yttria, it is preferred that yttria have a weight proportion of 0.1% to 2%. Where the assisting agent is calcia, it is preferred that calcia have a weight proportion of 0.02% to 0.5%. Where the assisting agent is magnesia, it is preferred that magnesia have a weight proportion of 0.02% to 0.4%. Where the assisting agent is ceria, it is preferred that ceria have a weight proportion of 0.02 to 0.5%.

While one kind of assisting agent is added above, at least two kinds of assisting agents may be added to constitute the ceramic substrate of the invention. In such a case, it is preferred that the assisting agents has a total proportion of 0.05 to 1.0 mol %. It is preferable that alumina have a weight proportion of 82% to 97%, and zirconia have a weight proportion of 2.5% to 17.5%. In addition, it is preferred that material powders of the ceramic components have a particle diameter range of 0.5 µm to 3 µm.

The mechanical strength, particularly the flexural strength, of the ceramic substrate that is, as described above, a fired body and has a material composition including alumina as the main component and zirconia, is greatly increased from a ceramic substrate made of only alumina. Further, by adding zirconia in a range of 10–30 wt %, the mechanical strength, particularly the flexibility, of the ceramic substrate is improved without lowering its heat conductivity. This allows the ceramic substrate itself to be made thinner, to thereby realize a CBC substrate for a semiconductor device which substrate has superior radiation performance.

By adding, in addition to zirconia, one of yttria, calcia, magnesia and ceria, the toughness of zirconia crystal grains can be improved while the ceramic substrate firing temperature is kept low. Instead of adding yttria, calcia, magnesia or ceria separately from zirconia, zirconia that is stabilized totally or partially by adding one or more of the above additives may be added to alumina, in which case similar advantages can also be obtained.

The ceramic substrate of the invention, which is a fired body and has a material composition including alumina as the main component, zirconia, and at least one additive selected from the group consisting of yttria, calcia, magnesia, and ceria, has much enhanced mechanical strength, particularly flexural strength. If the additional amount of zirconia is limited to a range of 2.5–17.5 wt %, the heat conductivity of the ceramic substrate can further be improved without sacrificing its mechanical strength, particularly flexibility. This allows the ceramic substrate itself to be made thinner, to thereby realize a CBC substrate for a semiconductor device which substrate has superior radiation performance.

DESCRIPTION OF THE PREFERRED EMBODIMENTS

An embodiment of the present invention will be hereinafter described.

First, zirconia ($ZrO_2$) and yttria ($Y_2O_3$) were added to alumina ($Al_2O_3$), and a resulting material was pulverized and mixed to produce particles of 0.5–3 μm in diameter. A resulting mixture was added with 8-wt % polyvinyl butyral (PVB). as a binder, a 50-wt % mixed liquid of toluene and xylene as a solvent, and 2-wt % dioctyl phthalate (DOP) as a plasticizer, kneaded for about 20 hours, and then shaped into a sheet form by a doctor blade method, to thereby provide a green sheet. The green sheet was pressed, i.e., punched to produce substrate pieces of a predetermined shape, which were then fired at 1,550°–1,650° C. Thus, ceramic substrates (sintered bodies) of 0.2–0.7 mm in thickness were formed.

Figure 11:
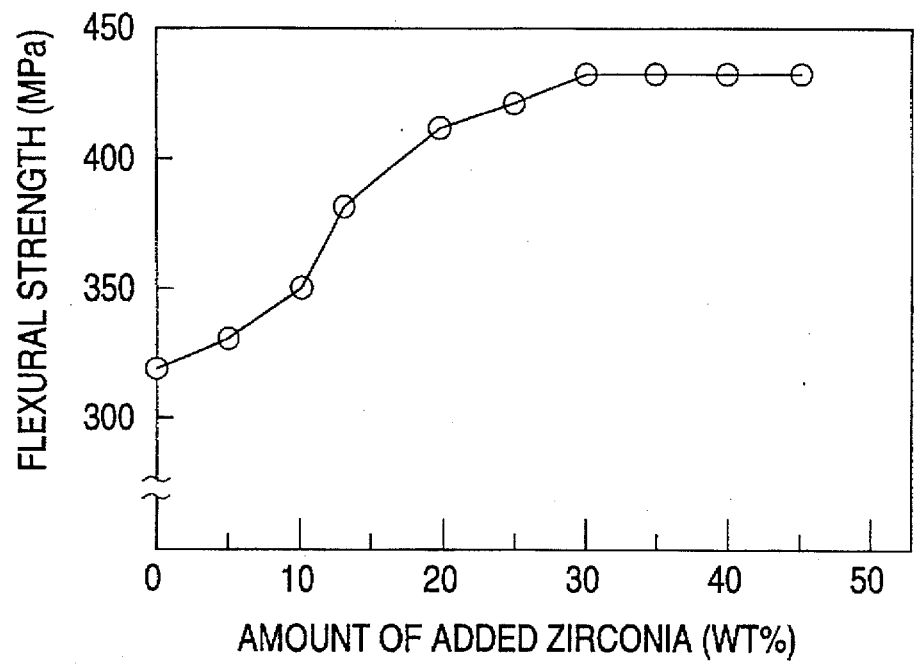
FIG. 11 is a graph showing a relationship between the flexural strength of ceramic substrates and the amount of zirconia added to alumina.

To evaluate mechanical properties of the ceramic substrate that was formed in the above manner by adding zirconia to alumina, another samples were prepared in the same manner while the amount of added zirconia was varied from 0 to 45 wt % and subjected to a strength test. Results of the strength test are shown in FIG. 11. As seen from FIG. 11, by adding zirconia to alumina by more than 10 wt %, the strength of the ceramic substrate is improved to 350–400 MPa from the case of using only alumina (amount of added zirconia: 0 wt % strength: about 300 MPa). It is noted that the strength is not improved any further even if the amount of added zirconia is increased exceeding 30 wt %.

Figure 12:
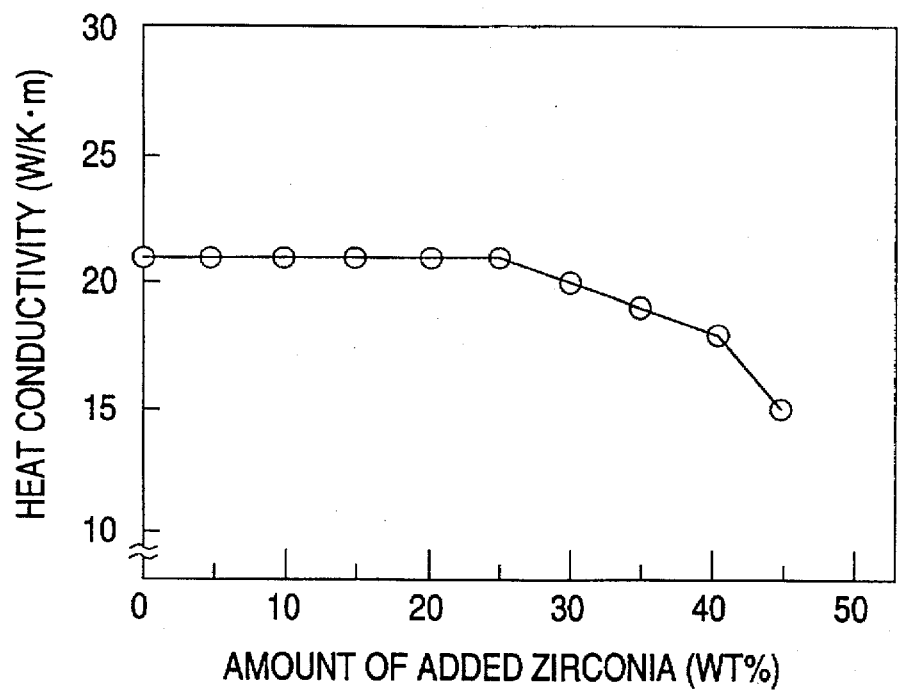
FIG. 12 is a graph showing a relationship between the heat conductivity of the ceramic substrates and the amount of zirconia added to alumina.

The heat conductivity of the above samples was also examined, to produce results as shown in FIG. 12. That is, the samples exhibit approximately the same heat conductivity as in the case of using only alumina as long as the amount of added zirconia is less than about 30 wt %. On the other hand, the heat conductivity decreases as the amount of added zirconia exceeds 30 wt %.

It is therefore concluded that by selecting the material composition of the ceramic substrate such that contents of alumina and zirconia are 70–90 wt % and 10–30 wt %, respectively, the mechanical strength of the ceramic substrate can be improved from the case of using only alumina while the equivalent heat conductivity is maintained.

Further, ceramic substrate samples in which the amount of added zirconia was 10 wt % and which had the same size (thickness: 0.32 mm; width: 35 mm) as those made only of alumina were subjected to a bending test in which the distance between supporting points was 40 mm. The samples using only alumina exhibited a maximum bending length of 0.30 mm. In contrast, it has been confirmed that the samples containing zirconia endure up to a bending length of 0.45 mm.

In the above-described material composition, yttria may be added to alumina and zirconia to assist sintering of alumina and zirconia and to improve the toughness of zirconia crystal grains. It is preferred that yttria be added in a range of 0.5–2 wt %. If the amount of added yttria is smaller than 0.5 wt %, the substrate firing temperature exceeds 1,650° C., to make it difficult to manufacture substrates. On other hand, if it exceeds 2 wt %, large variations likely occur in the contraction ratio and the strength of the ceramic substrate. It has been confirmed that similar advantages are obtained by adding, separately from zirconia, one of calcia, magnesia, ceria, etc. instead of yttria. It has also been confirmed that similar advantages are obtained by adding, to alumina, zirconia that is stabilized totally or partially by yttria, calcia, magnesia, ceria, or the like.

Figure 1:
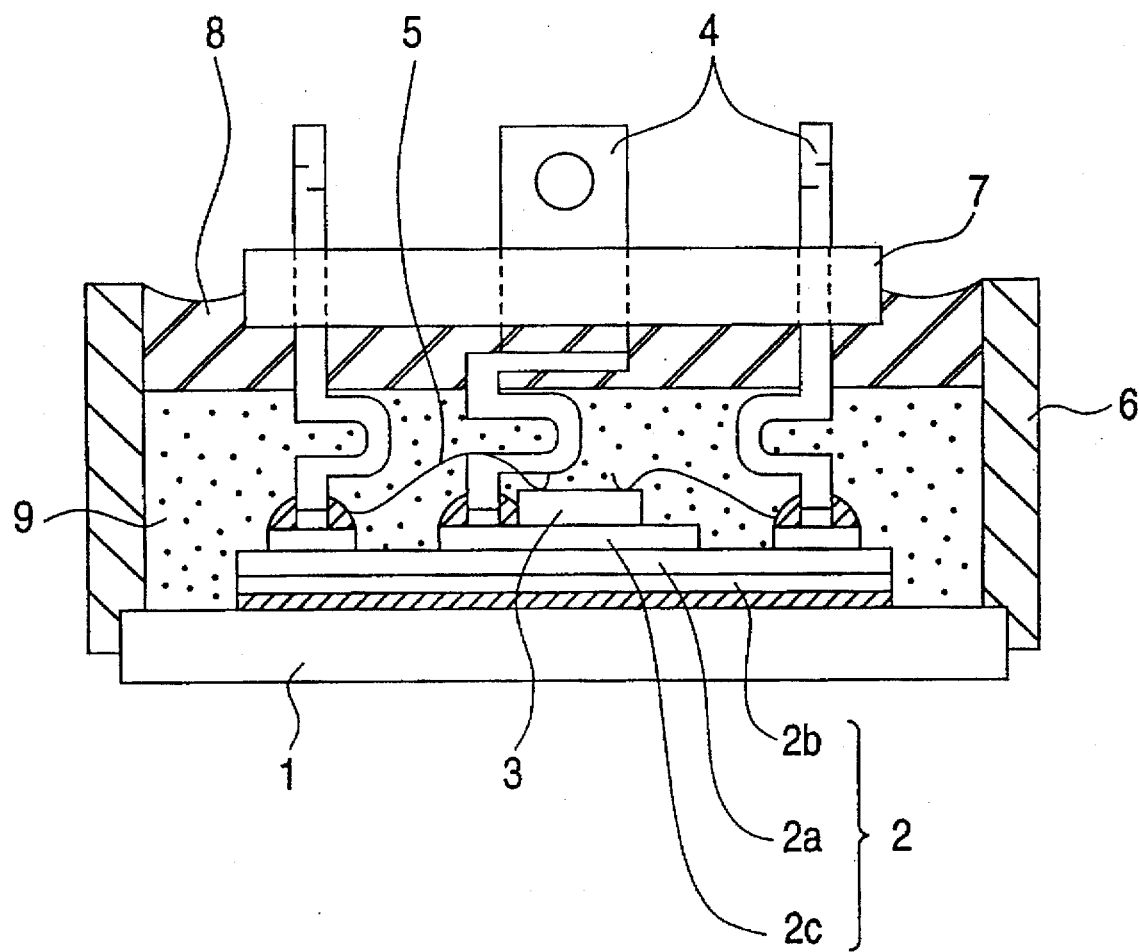
FIG. 1 is a sectional view showing a general configuration of a power transistor.
Figure 2A:
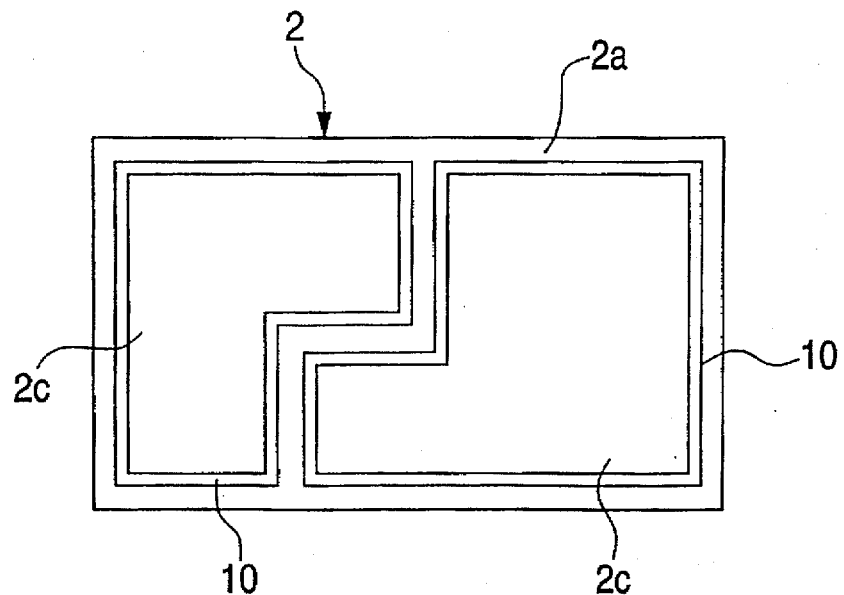
FIGS. 2A and 2B are a plan view and a partial sectional view, respectively, of a CBC substrate disclosed in Japanese Unexamined Patent Publication No. Hei. 3-145748.
Figure 2B:
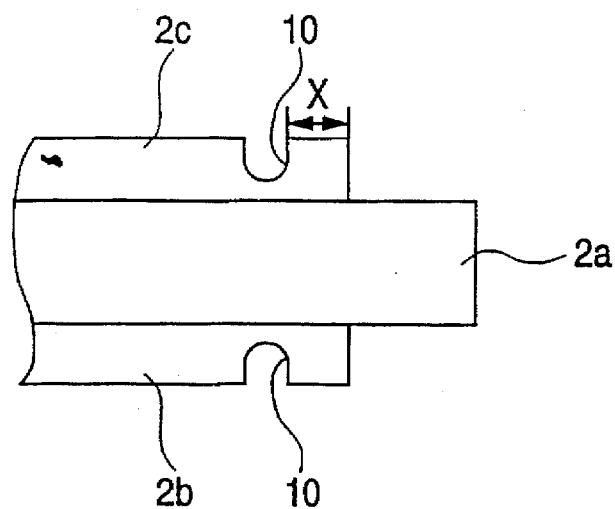

A semiconductor device as shown in FIG. 1 was assembled by using a CBC substrate that was formed by directly bonding 0.3-mm-thick tough pitch electrolytic copper plates to the upper and lower surfaces of the above-described zirconia-added alumina substrate (thickness: 0.32 mm) by placing the copper plates on the alumina substrate and heating that structure for 10 minutes in a nitrogen atmosphere at 1,050°–1,075° C. As comparative examples, similar semiconductor devices were assembled by using CBC substrates of 0.63 and 0.32 mm that were formed by using only alumina. The above assemblies were subjected to a mechanical deformation resistance test and an intermittent circuit test.

In the deformation resistance test, while the ceramic substrate was given a forcible deformation by applying external force to the radiation metal base, its deformation amount was measured until an insulation failure occurs in it. It has been found that the zirconia-added alumina substrate (thickness: 0.32 mm) and the 0.63-mm-thick alumina substrate exhibit almost the same resistance, whereas an insulation failure occurs in the alumina substrate of 0.32-mm-thick alumina substrate with approximately a half deformation amount. That is, in a practical sense, the thickness of the ceramic substrate can be reduced to about ½ by adding a proper amount of zirconia to alumina.

In the intermittent circuit test, it has been found that with the same collector loss, the temperature increase ΔTj of the semiconductor bonding block of the zirconia-added alumina substrate (thickness: 0.32 mm) is smaller by about 20% than that of the 0.63-mm-thick alumina substrate, and the intermittent current conduction resistance of the former is improved to 2.5–3 times that of the latter.

As is understood from the above tests, the ceramic substrate in which zirconia is added to alumina is superior in mechanical strength to the ceramic substrate using only alumina. Because the ceramic substrate can be made thinner, it is fully expected to be used as a substrate for a semiconductor device which substrate has superior radiation performance.

In the above embodiment, the ceramic substrate has a thickness of 0.32 mm. Substrates of 0.05–1 mm in thickness can be produced by the casting method. On the other hand, substrates having a thickness of more than 1 mm can be produced by a press molding method. First, a binding agent such as polyvinyl alcohol (PVA) is added to material powders. Then, they are subjected to wet blending, and finally this mixture as dried and granulated by a spray dryer is subjected to press molding.

Figure 3A:
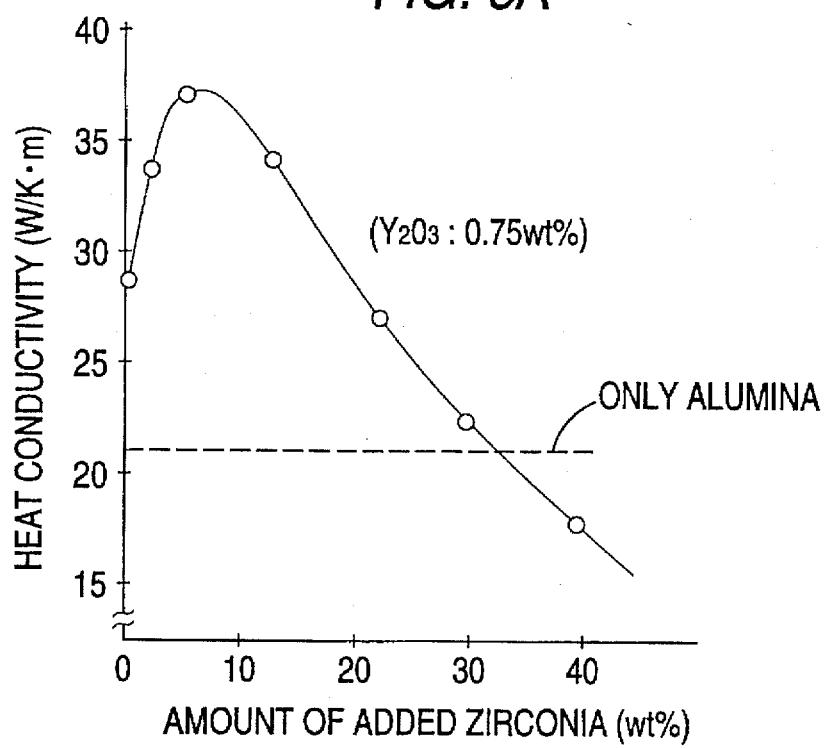
FIGS. 3A and 3B are graphs respectively showing a dependence on the amount of added zirconia of the heat conductivity of ceramic substrates produced by adding 0.75 wt % of yttria and a dependence on the amount of added zirconia of the flexural strength of those ceramic substrates and CBC substrates using those in an embodiment of the present invention.
Figure 3B:
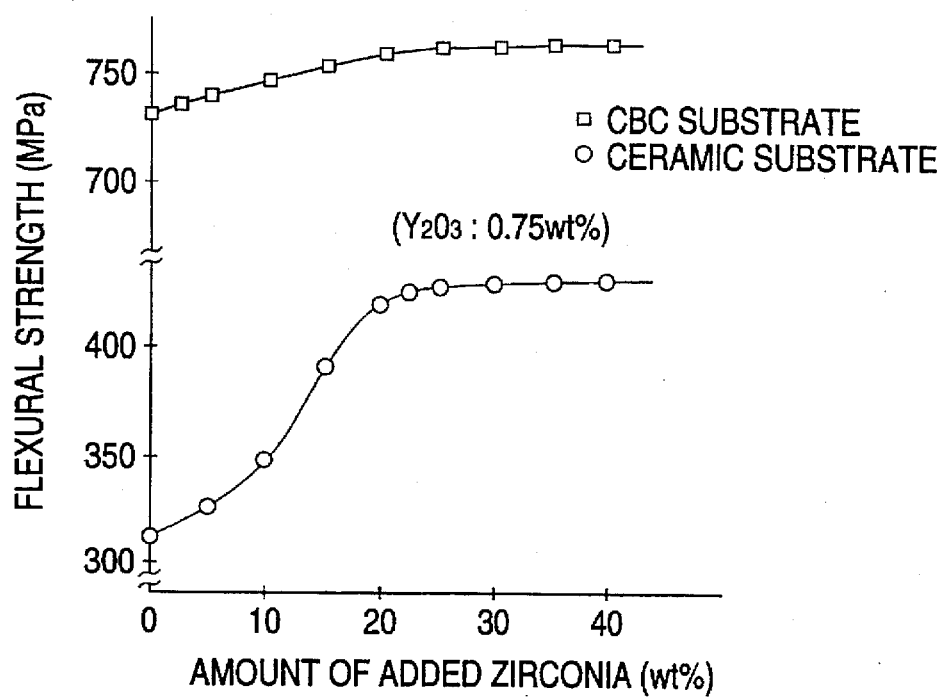

FIGS. 3A and 3B show characteristics of ceramic substrates produced by adding zirconia and yttria (0.75 wt %; partial stabilizing agent for zirconia) to alumina. More specifically, FIGS. 3A and 3B show evaluation results of the heat conductivity and the flexural strength in experiments in which samples of 5 mm (width)×60 mm (length)×0.5 mm (thickness) were produced with varied amounts of zirconia added to alumina. The heat conductivity increases as the zirconia amount decreases. Heat conductivity values larger than that of a ceramic substrate made only of alumina (indicated by a dashed line) are obtained when the zirconia amount is in a range of 0–30%. Further, heat conductivity values larger than 30 W/K·m, which is the maximum heat conductivity value that has ever been obtained conventionally as a value of α-alumina, when the amount of added zirconia is approximately in a range of 2.5–17.5%. This is believed due to a peak of the effect of adding the assisting agent of yttria. On the other hand, FIG. 3B shows flexural strength data (4-point bending). Data of ceramic substrate themselves are indicated by mark "o." The flexural strength increases as the amount of added zirconia increases, and is saturated when the amount of added zirconia exceeds about 25%. Data of CBC substrates in which copper plates are bonded to the front and back surfaces of a ceramic substrate are indicated by mark "□." Because of the structure in which a ceramic substrate is sandwiched between two tough copper substrates, the CBC substrates exhibit flexural strength values about two times larger than those of the ceramic substrates. In contrast to the case of the ceramic substrates. themselves, the CBC substrates do not exhibit any marked reduction in flexural strength. These effects are believed due to a large amount (0.75%) of intentionally added zirconia. On the other hand, in ordinary firing of ceramics, yttria of a very small amount (less than 0.01 wt %), which is equivalent to amounts of impurities, is introduced inevitably.

Figure 4A:
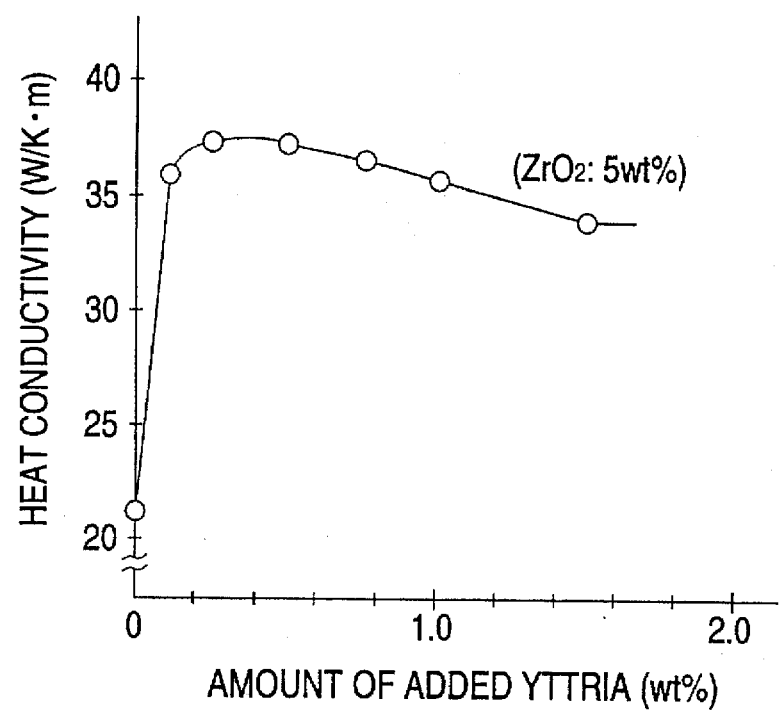
FIGS. 4A and 4B are graphs respectively showing a dependence on the amount of added yttria of the heat conductivity of ceramic substrates produced by adding 5 wt % of zirconia and a dependence on the amount of added yttria of the flexural strength of those ceramic substrates and CBC substrates using those in the embodiment of the present invention.
Figure 4B:
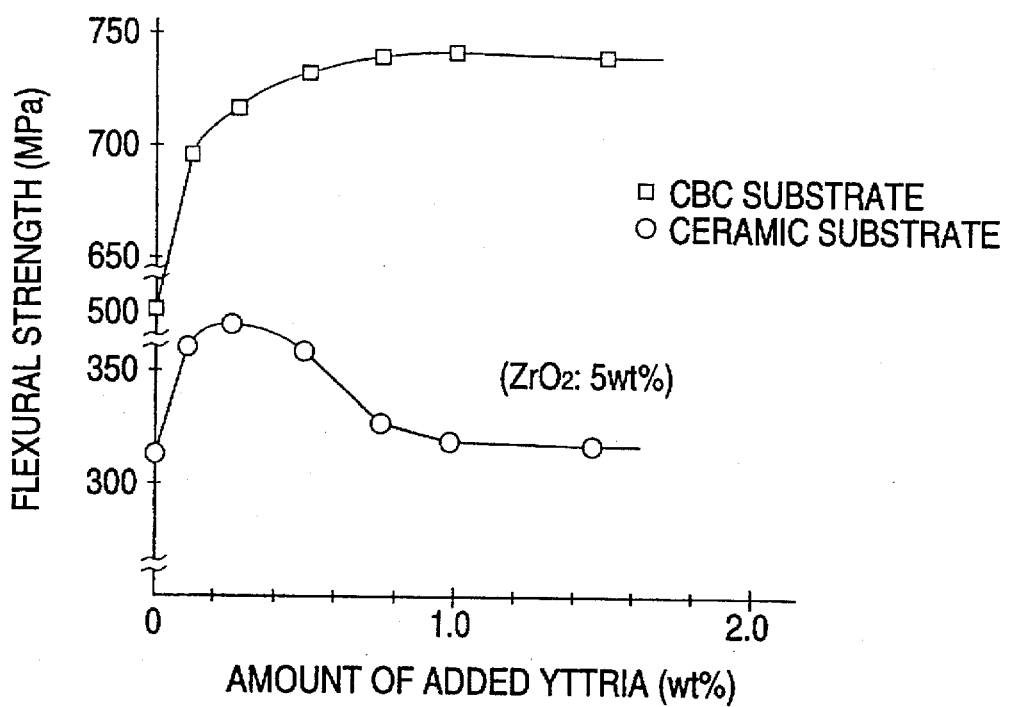

FIGS. 4A and 4B show data that indicate influences of added yttria. FIG. 4A shows a dependence on the amount of added yttria of the heat conductivity of ceramic substrates in which zirconia is added to alumina by 5 wt %. The maximum heat conductivity value (peak value) is obtained when the amount of yttria is in a range of 0.2–0.6 wt %. When the amount of yttria is 0% (i.e., when yttria is not introduced intentionally), the heat conductivity is approximately equal to the value of ordinary alumina (about 22 W/K·m) shown in FIG. 3A.

FIG. 4B shows flexural strength data. While ceramic substrates themselves exhibit the maximum strength value at 0.25 wt %, the flexural strength of CBC substrates gradually decreases as the amount of yttria decreases. As in the case of the heat conductivity, the flexural strength steeply decreases as the amount of yttria approaches 0%. The above discussion means that the amount of added yttria (assisting agent) greatly influences the characteristics of the substrates. However, if the amount of yttria exceeds 2 wt %, there occurs a large variation in the contraction ratio and strength of ceramic substrates. Therefore, it can be said that the optimum range of the amount of added yttria is 0.1 to 2 wt %.

Figure 5:
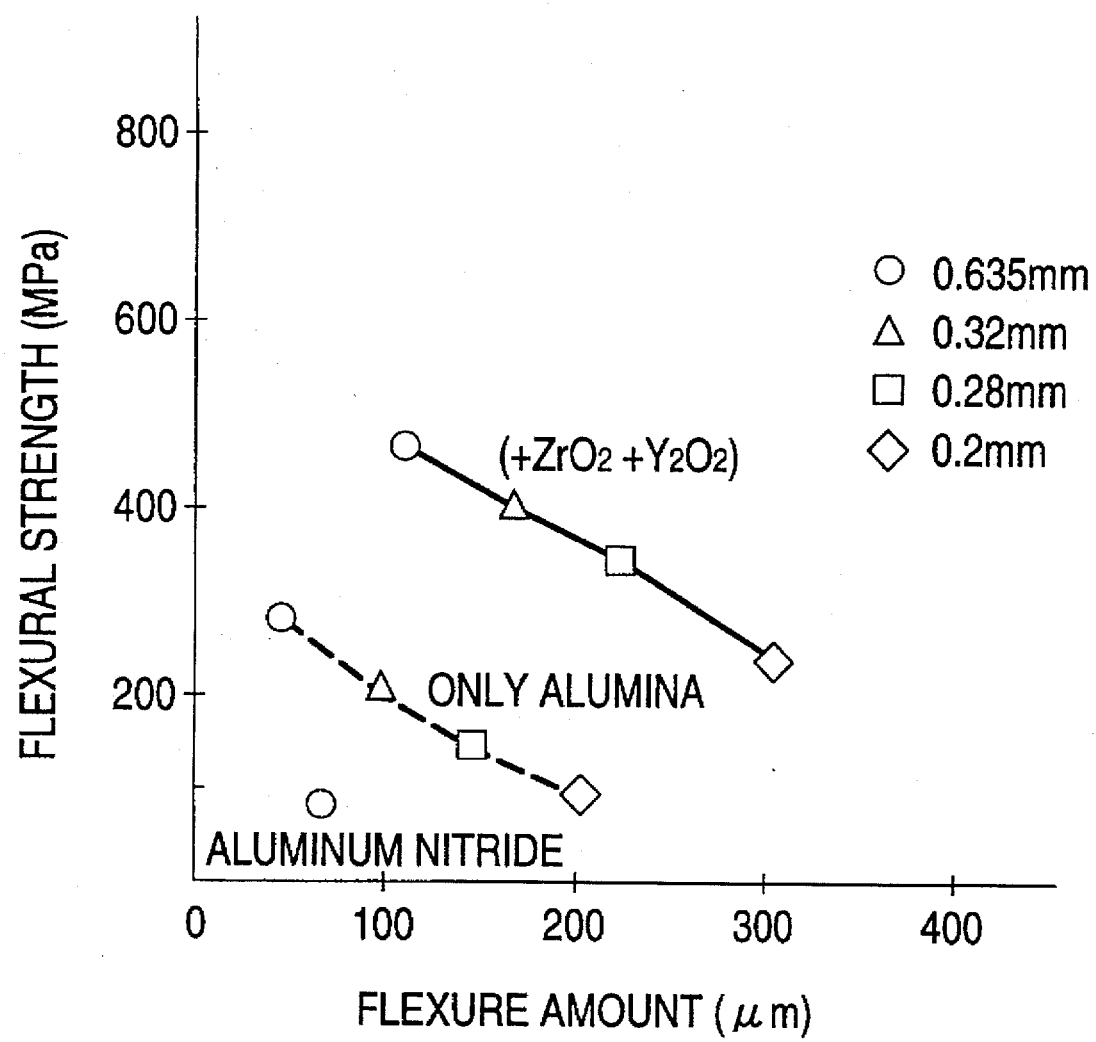
FIG. 5 is a graph showing a relationship among the flexural strength, the flexure amount, and the thickness of ceramic substrates produced by adding 0.75-wt % yttria and 22.5-wt % zirconia in the embodiment of the invention, as compared to cases of ceramic substrates made only of alumina and ceramic substrates made of aluminum nitride.

The flexural strength and the amount of flexure at fracture strongly depends on the thickness of ceramic substrates. FIG. 5 exemplifies how the flexural strength and the flexure amount vary with the thickness of ceramic substrates themselves in a case where the amount of added zirconia is 22.5 wt % and the amount of added yttria is 0.75 wt %. FIG. 5 also shows other cases of conventional ceramic substrates made only of alumina and those made of aluminum nitride. It has been proved that the ceramic substrates in which 22.5-wt % zirconia and 0.75-wt % yttria are added to alumina exhibit higher strength, flexibility (toughness), and resistance to impact than those exhibited by the ceramic substrates made only of alumina and of aluminum nitride.

Figure 6:
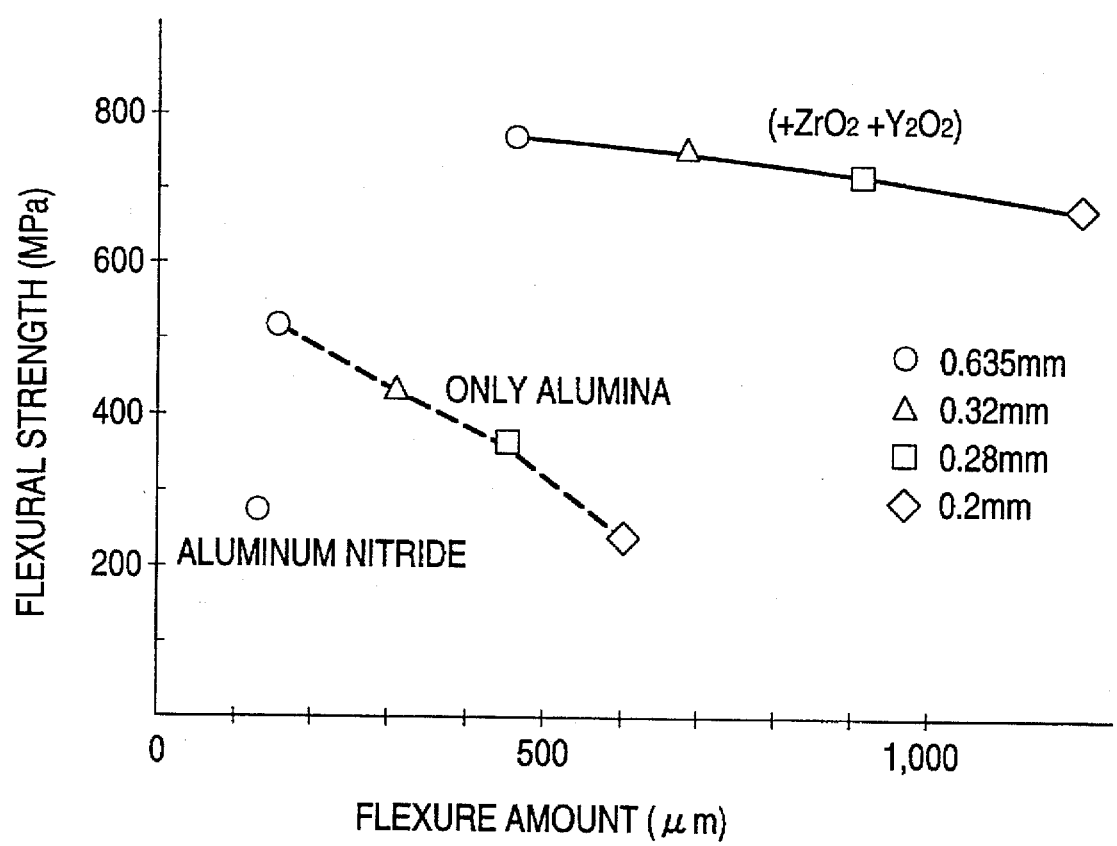
FIG. 6 is a graph showing a relationship among the flexural strength, the flexure amount, and the thickness of CBC substrates using the ceramic substrates produced by adding 0.75-wt % yttria and 22.5-wt % zirconia in the embodiment of the invention, as compared to cases of CBC substrates using ceramic substrates made only of alumina and ceramic substrates made of aluminum nitride.

FIG. 6 shows how the flexural strength and the flexure amount vary with the thickness of the ceramic substrates in a case of CBC substrates constructed by using the above ceramic substrates. Although both the flexural strength and the flexure amount are increased regardless of the type of CBC substrates, the CBC substrates using the ceramic substrates added with 22.5-wt % zirconia and 0.75-wt % yttria exhibit a higher degree of improvements in characteristics than the other types of CBC substrates.

The higher degree of improvement in the flexural strength of a CBC substrate according to the invention provides the following advantages: Where a semiconductor device is constructed in such a manner that the CBC substrate 2 is mounted on the radiation metal base 1 as a heat sink as shown in FIG. 1, the fundamental surface of the radiation metal base 1 inevitably has a certain bend, which greatly varies from one product to another depending on the manufacturing method of the metal base 1. Although the bend of the metal base 1 exerts initial stress on the CBC substrate 2, there occurs no cracking or the like in the CBC substrate 2 because it has high flexural strength and a large flexure amount. Therefore, the CBC substrate already having a high heat conductivity can be made thinner, which means a synergistic improvement of the heat conductivity. In addition, because of the alumina-based composition, the ceramic substrate of this embodiment can be manufactured by the same apparatus and method as the alumina substrate, i.e., can be manufactured at a lower cost than the ceramic substrate mainly made of aluminum nitride.

The effects of adding, as the assisting agent, materials other than yttria, i.e., magnesia (MgO), calcia (CaO), and ceria ($CeO_2$) have also been studied, and it has been found that calcia and ceria exhibit approximately the same effects as yttria. As described below, it has been found that the addition of magnesia improves the characteristics a little more than the addition of yttria.

Figure 7A:
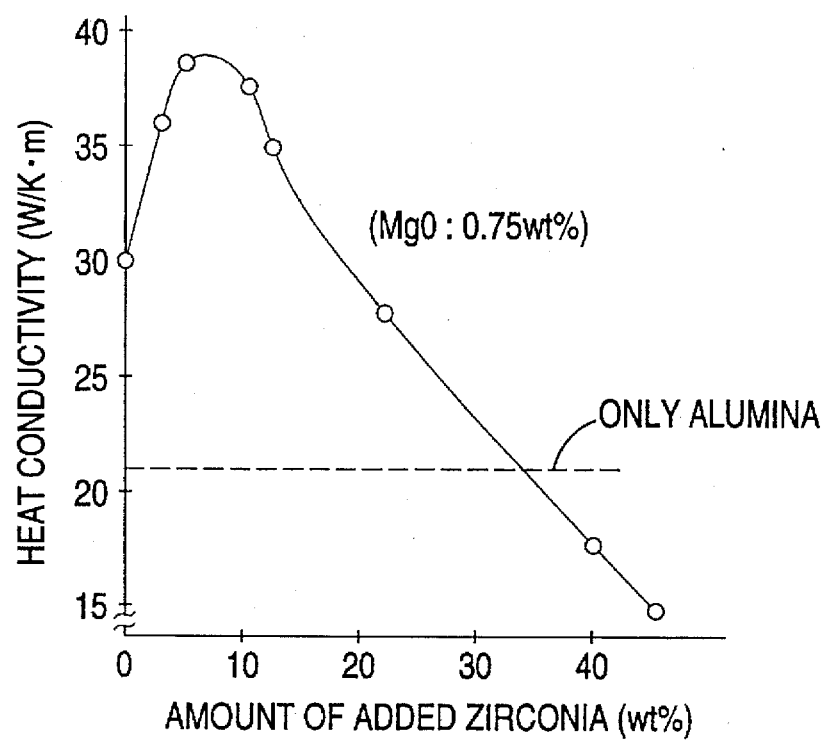
FIGS. 7A and 7B are graphs respectively showing a dependence on the amount of added zirconia of the heat conductivity of ceramic substrates produced by adding 0.75 wt % of magnesia and a dependence on the amount of added zirconia of the flexural strength of those ceramic substrates and CBC substrates using those in the embodiment of the invention.
Figure 7B:
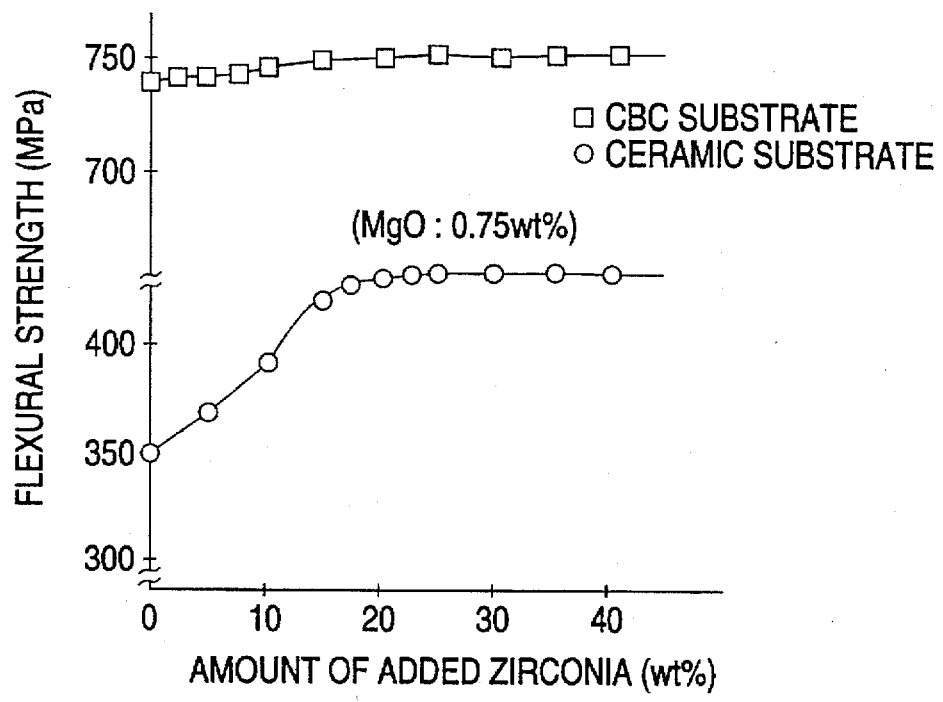

FIGS. 7A and 7B and FIGS. 8A and 8B show examples of such improvements. FIGS. 7A and 7B show data of the heat conductivity and the flexural strength in a case where magnesia was added by 0.75 wt %. Heat conductivity values of FIG. 7A are larger by about 5% than in the case of adding yttria. Flexural strength values of FIG. 7B are larger than in the case of adding yttria in a range where the amount of added zirconia is small. As a result, also the characteristics of CBC substrates are somewhat improved.

Figure 8A:
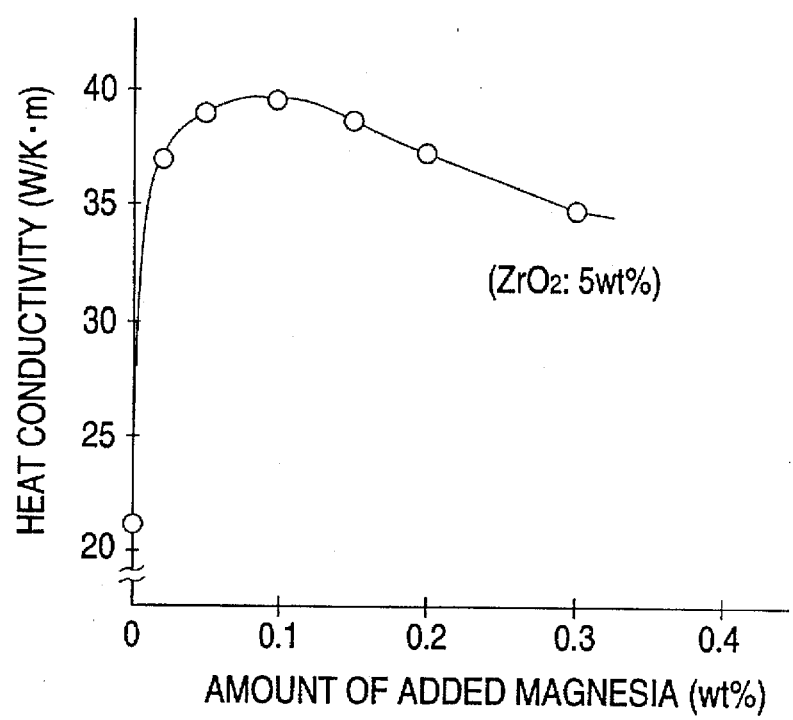
FIGS. 8A and 8B are graphs respectively showing a dependence on the amount of added magnesia of the heat conductivity of ceramic substrates produced by adding 5 wt % of zirconia and a dependence on the amount of added magnesia of the flexural strength of those ceramic substrates and CBC substrates using those in the embodiment of the invention.
Figure 8B:
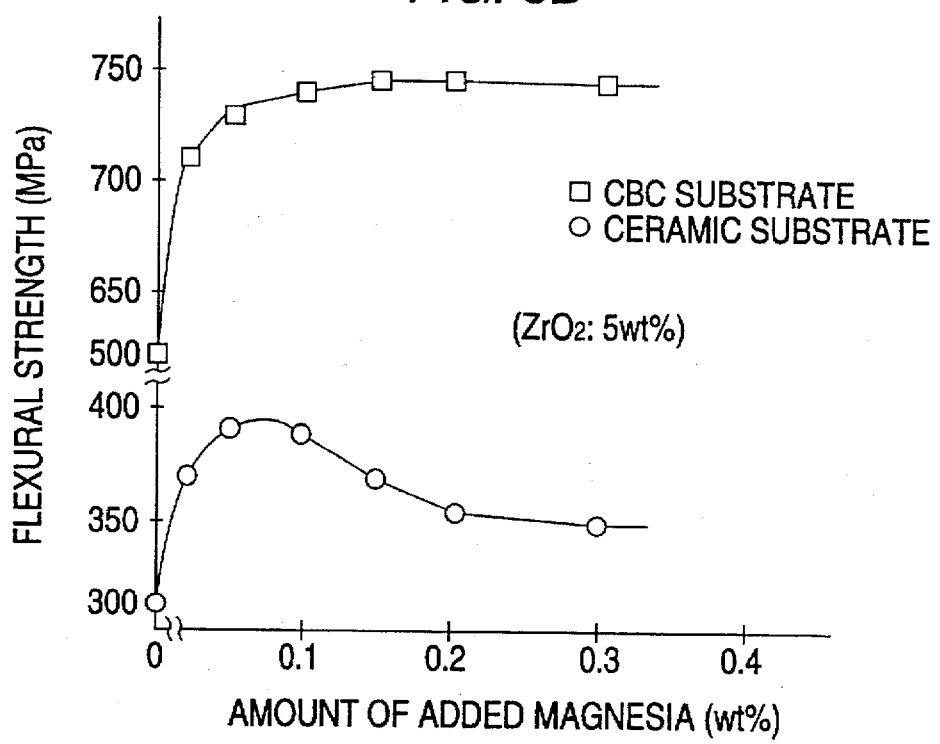

FIGS. 8A and 8B show dependences of the heat conductivity and the flexural strength, respectively, on the amount of added magnesia. Comparison of the above-described case with that shown in FIGS. 4A and 4B, where yttria was added, shows that each of the heat conductivity and the flexural strength is approximately the same in both cases. However, if the amount of added magnesia exceeds 0.4 wt %, there occurs a large variation in the contraction ratio and strength of ceramic substrates. Therefore, it can be said that the optimum range of the amount of added magnesia is 0.01 to 0.4 wt %.

The addition of calcia or ceria provides almost the same effects as the addition of yttria. The optimum range of the additional amount is 0.02–0.5 wt % in the case of calcia, and 0.05–2 wt % in the case of ceria.

Ceramic substrates were prepared by adding a mixture of at least two additives of yttria, magnesia, calcia, and ceria, and their characteristics were examined. The effects of adding those different additives can be explained by expressing the additional amount in mol %.

Figure 9A:
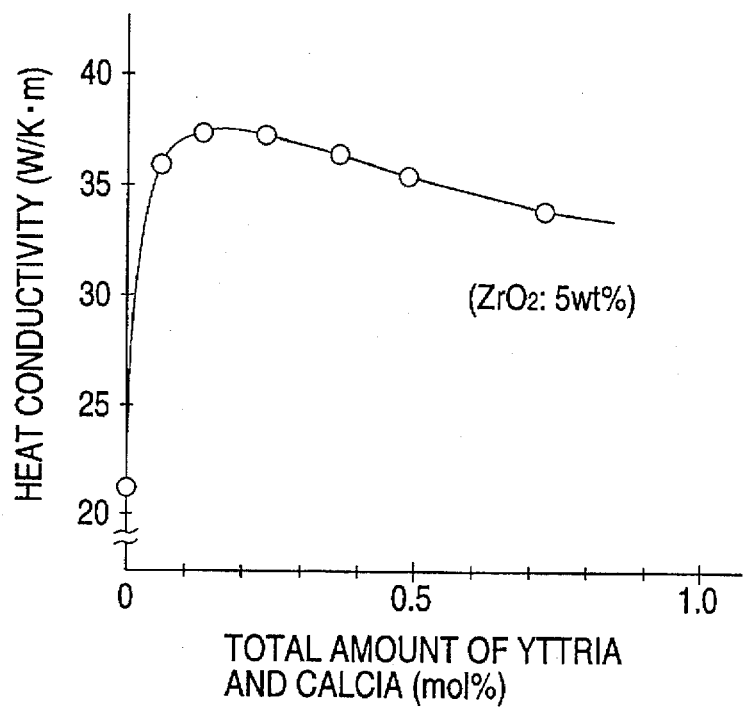
FIGS. 9A and 9B are graphs respectively showing a dependence on the additional amount of a mixture of yttria and calcia of the heat conductivity of ceramic substrates produced by adding 5 wt % of zirconia and a dependence on the additional amount of a mixture of yttria and calcia of the flexural strength of those ceramic substrates and CBC substrates using those in the embodiment of the invention.
Figure 9B:
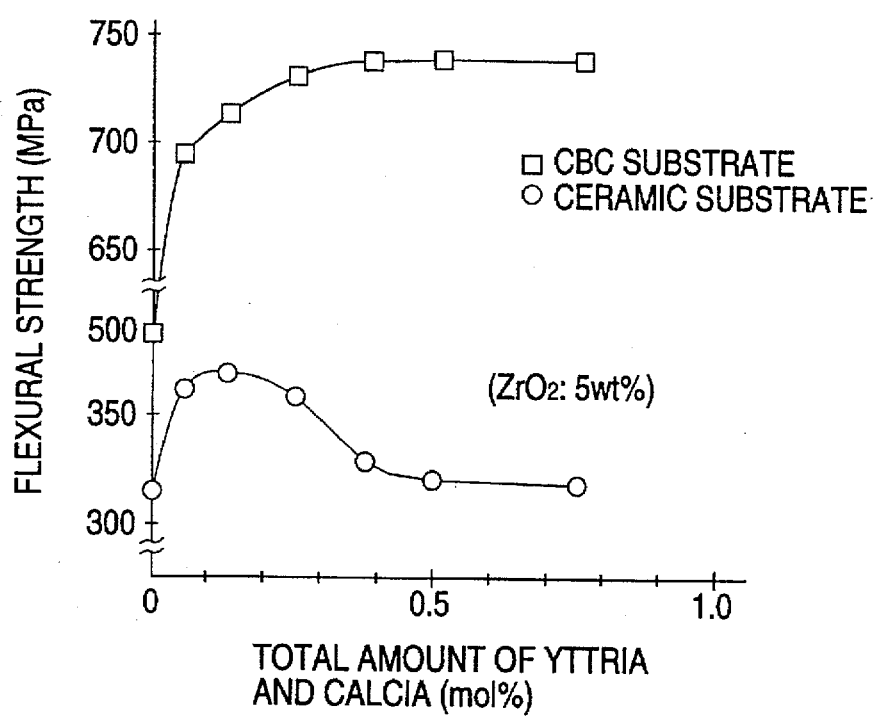

FIGS. 9A and 9B show results of ceramic substrates that were produced by adding a mixture of yttria and calcia.

Where the additional amount of zirconia is 5 wt %, the heat conductivity has a maximum value when the sum of additional amounts of yttria and calcia is 0.1–0.3 mol %, and the flexural strength of ceramic substrates has a maximum value when the sum is 0.1–0.2 mol %.

In ceramic substrates produced by adding any of combinations of yttria and ceria, calcia and ceria, and yttria, ceria and calcia, similar results to those with the above mixture of yttria and calcia were obtained. However, if the sum amount of the added materials exceeds 1 mol %, there occur variations of the contraction ratio and the strength of ceramic substrates. Therefore, it can be said that the optimum range of the amount of a mixture of the above ceramic additives is 0.05 to 1 mol %.

Figure 10A:
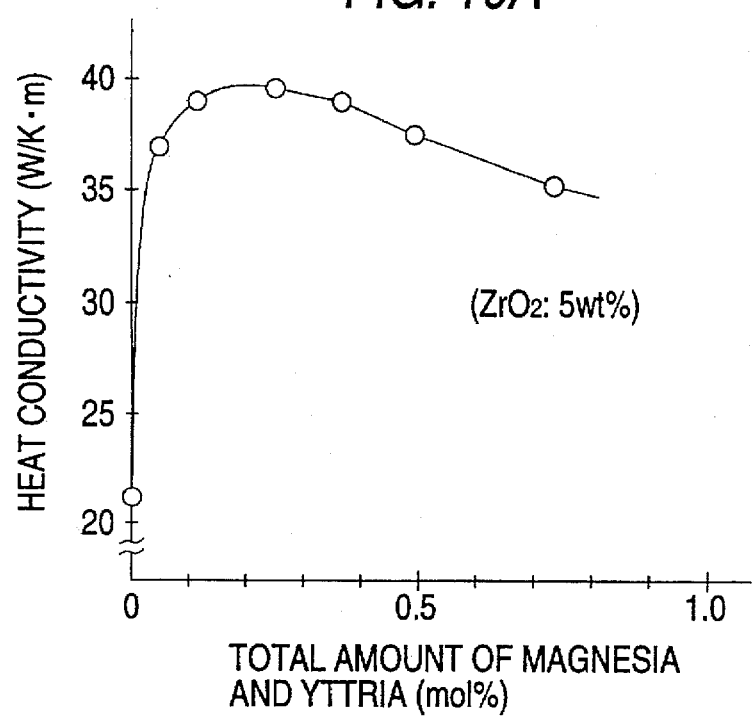
FIGS. 10A and 10B are graphs respectively showing a dependence on the additional amount of a mixture of magnesia and yttria of the heat conductivity of ceramic substrates produced by adding 5 wt % of zirconia and a dependence on the additional amount of a mixture of magnesia and yttria of the flexural strength of those ceramic substrates and CBC substrates using those in the embodiment of the invention.
Figure 10B:
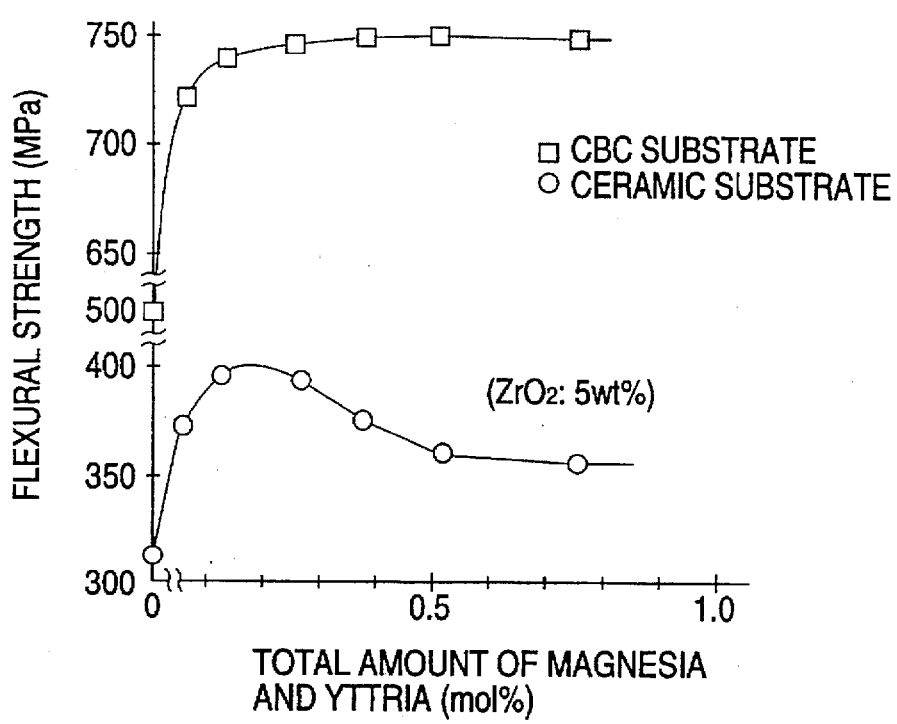

FIGS. 10A and 10B show results of ceramic substrates produced by adding a mixture of magnesia and yttria, in which the amount of added zirconia is 5 wt %. One can find a small increase of the flexural strength from the case of adding only magnesia (FIGS. 8A and 8B). Similar effects were obtained in any of combinations of magnesia and calcia, magnesia and ceria, magnesia and yttria, magnesia, yttria and calcia, magnesia, calcia and ceria, and magnesia, yttria, calcia and ceria. However, if the sum additional amount of the above assisting agents exceeds 1 mol %, there occurs variations of the contraction ratio and the strength of ceramic substrates. Therefore, it can be said that the optimum range of the additional amount of a mixture is 0.05 to 1 mol %.

In the above embodiment, the effects shown in FIGS. 5 and 6 that were obtained in the case of adding yttria were also obtained when one of magnesia, calcia and ceria was added, or a mixture of any combination of magnesia, calcia, ceria and yttria was added.

A description will now be given of results of other experiments. Semiconductor devices as shown in FIG. 1 were assembled by using CBC substrates that employ 0.2-mm-thick ceramic substrates of the above embodiment. As a comparative example, semiconductor devices as shown in FIG. 1 were also produced by using CBC substrates that employ 0.63-mm-thick aluminum nitride substrates. These two types of assemblies were subjected to a mechanical deformation resistance test and an intermittent circuit test.

In the deformation resistance test, the radiation metal base 1 was forcibly deformed by external force, and the deformation amount and the strength of the ceramic substrate 2a were measured until an insulation failure occurred. Test results revealed that when ceramic substrates of the above embodiment were used, the strength and the deformation amount were improved by factors of 2.5 and 4, respectively, from the case of using aluminum nitride substrates; that is, an insulation failure did not occur until the ceramic substrate 2a was deformed to a much higher degree. That is, in practice, it has become possible to reduce the thickness of the ceramics substrate 2a to ⅓ by adding, to alumina, a proper amount of zirconia and/or an additive (magnesia, calcia, ceria, and yttria).

In the intermittent circuit test, it has been found that with the same collector loss, the temperature increase ΔT of the semiconductor bonding portion of devices using ceramic substrates of the embodiment is equivalent to or smaller than that of devices using aluminum nitride substrates, and that the devices of the invention have several times higher intermittent current conduction resistance than the devices using ordinary aluminum nitride substrates.

As is understood from the above tests, the ceramic substrate of this embodiment is superior in mechanical characteristics to the alumina and aluminum nitride ceramic substrates. Because the ceramic substrate can be made thinner, it is fully expected to be used as a substrate for a semiconductor device which substrate has superior radiation performance.

Experiments were also conducted to check combinations of thicknesses of the ceramic substrate 2a of the above embodiment and the copper plates 2b and 2c that constituted the CBC substrate 2 with which combinations a crack such as an edge crack did not occur when the CBC substrate 2 was subjected to a heat treatment of −40° C. to 125° C. Results are shown in Table 1.

TABLE 1

| Thickness of ceramic substrate (mm) | Thickness of copper plates (mm) | Grooves (thickness of residual copper portion (mm)) |
|---|---|---|
| 0.64 | 0.3 | x |
|  | 0.4 | x |
|  | 0.5 | o (0.3) |
|  | 0.6 | o (0.3) |
| 0.32 | 0.2 | x |
|  | 0.3 | x |
|  | 0.4 | x |
|  | 0.5 | o (0.3) |
|  | 0.6 | o (0.3) |
| 0.2 | 0.2 | x |
|  | 0.3 | x |
|  | 0.4 | o (0.2) |
|  | 0.5 | o (0.2) |
|  | 0.6 | o (0.2) |

In the experiments, the groove depth was set at about 0.2 mm. In Table 1, mark "o" means that the copper plates 2b and 2c have grooves and mark "x" means that they do not have grooves. Each parenthesized value in the column entitled "groove" means the thickness of the copper plates 2a and 2b at groove portions.

Table 1 shows that in the CBC substrates of the embodiment, where the ceramic substrate 2a is 0.64 mm in thickness, the copper plates 2b and 2c that are not thicker than 4 mm do not need grooves. In the case of the copper plates 2b and 2c that are thicker than 0.64 mm, it has been confirmed that occurrence of a crack can be prevented by forming grooves so as to leave copper portions of 0.3 mm in thickness. It is not necessary to form a groove at a position that is spaced inward from the perimeter of the copper plates 2b or 2c by a distance approximately equal to its thickness. A groove may be formed closer to the perimeter as long as it can be formed stably. As a result, the chip mounting area of the copper plate 2c can be made wider than in the conventional case.

Where the thickness of the ceramic substrate 2a was 0.32 mm, without grooves no crack occurred even when the copper plates 2b and 2c having a thickness of 0.4 mm (thicker than the ceramic substrate 2a) were bonded to the ceramic substrate 2a. Similarly, where the thickness of the ceramic substrate 2a was 0.2 mm, without grooves no crack occurred even when the copper plates 2b and 2c having a thickness of 0.3 mm (thicker than the ceramic substrate 2a) were bonded to the ceramic substrate 2a. However, in either case, grooves were needed when the copper plates 2b and 2c were thicker than the above value.

The above advantages are due to improved strength of the bonding between the ceramic substrate 2a and the copper plates 2b and 2c because of the use of the ceramic substrate 2a having high fracture toughness. It is preferred that grooves be formed when the thickness of the copper plates $2b$ and $2c$ is 0.5 mm or more. It is also preferred that grooves be formed when the copper plates $2b$ and $2c$ are thicker than the ceramic substrate $2a$. Where the ceramic substrate $2a$ is thicker than the copper plates $2b$ and $2c$, the thickness of the copper plates $2b$ and $2c$ at the groove portions may be set at about ½ of that of the other portions. Where the ceramic substrate $2a$ is thinner than the copper plates $2b$ and $2c$, the thickness of the copper plates $2b$ and $2c$ at the groove portions may be set approximately equal to that of the ceramic substrate $2a$ or about 0.5 mm larger than the latter.

Semiconductor devices as shown in FIG. 1 were assembled by using CBC substrates of this embodiment having various combinations of parts: 0.64-mm-thick ceramic substrate/0.3-mm-thick copper plates (without grooves); 0.32-mm-thick ceramic. substrate/0.5-mm-thick copper plates (groove depth: 0.1 mm; residual thickness: 0.4 mm); 0.2-mm-thick ceramic substrate/0.3-mm-thick copper substrates (without grooves); and 0.2-mm-thick ceramic substrate/0.5-mm-thick copper plates (groove depth: 0.2 mm; residual thickness: 0.3 mm). As a comparative example, similar semiconductor substrates were assembled using a CBC substrate consisting of a 0.64-mm-thick alumina substrate and 0.3-mm-thick copper plates formed with 0.2-mm-deep grooves at a position 0.3 mm spaced inward from the perimeter. The above assemblies were subjected to a mechanical deformation resistance test, a heat cycle test, and an electrical test.

In the deformation resistance test, the radiation metal base 1 was forcibly deformed by applying external force to it, and the deformation amount and the strength of the ceramic substrate $2a$ were measured until an insulation failure occurred. This test showed that the deformation amount and the strength with the combinations of 0.64-mm-thick ceramic substrate/0.3-mm-thick copper plates (without grooves); 0.32-mm-thick ceramic substrate/0.5-mm-thick copper plates (groove depth: 0.1 mm; residual thickness: 0.4 mm); 0.2-mm-thick ceramic substrate/0.3-mm-thick copper substrates (without grooves); and 0.2-mm-thick ceramic substrate/0.5-mm-thick copper plates (groove depth: 0.2 mm; residual thickness: 0.3 mm) were greatly improved by factors of 3/1.5, 4/1.5, 8/1.4, and 8/1.4, respectively, from those with the conventional CBC substrate.

In the heat cycle test, any of the above combinations showed resistance equivalent to that with the CBC substrate using the 0.64-mm-thick alumina substrate.

In the electrical test, a device using 0.5-mm-thick copper substrates exhibited 10–15% improvement in a collector-emitter voltage $V_{CE(s)}$ characteristic resulting from the on-resistance of a power transistor mounted on the CBC substrate from a device using 0.3-mm-thick copper substrates. Further, it has become apparent that the transitional temperature rise of the former device is about 20% smaller than that of the latter device.

As is apparent from the above description, the ceramic substrate of the embodiment is superior in mechanical characteristics to the conventional alumina substrate, and is suitable for a highly radiative CBC substrate to be used in a semiconductor device by virtue of improved radiation performance of the ceramic substrate itself that is thinner than the conventional one. Further, by making the copper plates thicker, the on-resistance can be reduced, which makes it possible to increase the current density of a semiconductor chip that is mounted on the CBC substrate.

In the above embodiment, the ceramic substrate $2a$ has a thickness of 0.5 or 0.2 mm. A sheet-like substrate of 0.05–5 mm in thickness can be produced by using, as a forming method, the doctor blade method, extrusion rolling method, calender method, or the like. On the other hand, a substrate having a large variation in the cross-sectional shape can be produced by a press molding method in which a binding agent such as polyvinyl alcohol (PVA) is added to material powders, they are subjected to wet blending, and then a mixture as dried and granulated by a spray dryer is subjected to press molding.

If the mixture produced by the wet blending is subjected to extrusion, a substrate that is uniform in the longitudinal direction and has a variation in cross section can be obtained. Further, if the mixture is subjected to injection molding, a substrate of desired shape, i.e., a substrate that has a variation both in the longitudinal direction and in cross section can be obtained. These types of substrates are superior in that they hardly cause a positional deviation in a bonding step, because each of these substrates can be positioned with respect to the copper plates by using a recess formed therein.

In the above embodiment, the direct bonding method is employed to bond the copper plates $2b$ and $2c$ to the ceramic substrate $2a$. The direct bonding method is performed such that in a state that the copper plates $2b$ and $2c$ are brought in contact with the ceramic substrate $2a$, they are heated in a nitrogen atmosphere of a temperature between the copper-copper oxide eutectic temperature (1,065° C.) and the melting point of copper (1,083° C.). As a result, oxygen and copper, both being a very small amount, react with each other to produce a molten liquid, which in turn reacts with ceramics. Thus, strong bonding can be obtained. Since the bonding layer between ceramics and copper contains nothing that obstructs heat conduction, the CBC substrate 2 of the embodiment is superior both in heat radiation and in electrical insulation, and the surfaces of the copper plates $2b$ and $2c$ allow superior soldering and wire bonding and high bonding strength.

Instead of the direct bonding method, there may be employed a chemical boding method such as an active metal method and a metallizing method in which bonding is effected with silver solder that is added with titanium. The active metal method utilizes a phenomenon that intense reaction occurs where titanium zirconium (called "active metal") and ceramics are heated in a contact state. A metal-ceramics bonded body is produced according to the following methods:

1) placing active metal between ceramics and sealing metal;
2) applying to a bonding portion of ceramics a paste consisting of a mixture of active metal and a small amount of binder that is easily evaporated on heating (the mixture is in advance dissolved into an organic solvent such as acetone or butyl acetate); and
3) subjecting to a heat treatment a paste containing a chemical substance, e.g., titanium hydrides, that changes to active metal on heating (at about 650° C.) (the paste is applied to a bonding portion of ceramics as with the above method).

Since the active metal method can provide stable bonding by a single heat treatment and allows the bonding temperature to be set low, it is superior, for instance, in that it facilitates designing a flat substrate (i.e., a substrate having a small warp).

The metallizing method, in which a powder of refractory metal such as tungsten or molybdenum is fired onto the surface of ceramics, can provide very strong bonding. More specifically, the metallizing method proceeds in the following manner. Fine particles (usually 1–2 μm in diameter) of tungsten, tungsten carbide, or molybdenum and an additive such as manganese, manganese oxide, or oxide flux are mixed and pulverized in a stable organic solvent such as acetone or butyl acetate, and then dried. A homogeneous paste is produced by adding to the dried mixture a binder such as ethyl cellulose and cellosolve or amine-type solvent, and applied to ceramics. A resulting structure is dried, and then heated at 1,400°–1,700° C. in a hydrogen or forming gas atmosphere that is contained in a furnace, to cause ceramics and the refractory metal to react with each other. Thereafter, a copper layer is fired, by plating, onto a structure obtained by the above process.

As described above, according to the invention, the CBC substrate employs a ceramic substrate produced by high-temperature-firing alumina that is added with additives such as yttria, calcia, magnesia, and ceria, the mechanical strength can be greatly enhanced from the conventional CBC substrate that uses a ceramic substrate made only of alumina or a aluminum nitride substrate. Therefore, in practice, the ceramic substrate can be made thinner, to enable provision of a highly radiative CBC substrate for a semiconductor device. In particular, by applying the CBC substrate of the invention to a power transistor module etc., the semiconductor device can be miniaturized, its cost can be reduced, and its current capacity can be increased.

Where the ceramic substrate contains alumina at a weight proportion not less than 70% and less than 100%, zirconia at a weight proportion more than 0% and not more than 30% and additives selected from the group consisting of yttria, calcia, magnesia, and ceria at a total weight proportion of 0.02% to 2%, it has practically superior flexural strength and high heat conductivity. As a substrate for a semiconductor device, such a ceramic substrate is superior in strength, insulation performance, heat conductivity, and cost.

What is claimed:

1. A substrate for a semiconductor device, comprising:
   a ceramic substrate having a material composition including alumina as a main component and zirconia; and
   a copper plate bonded to said ceramic substrate,
   wherein said material composition of said ceramic substrate is such that said alumina has a weight proportion of 70% to 90% and said zirconia has a weight proportion of 10% to 30%.

2. The substrate of claim 1, wherein said material composition of said ceramic substrate further includes at least one additive selected from the group consisting of yttria, calcia, magnesia, and ceria that each has a weight proportion of 0.5% to 2%.

3. The substrate of claim 1, wherein said substrate has a thickness of 0.05–1 mm.

4. The substrate of claim 1, wherein said substrate has a bending strength greater than 350 MPa.

5. The substrate of claim 3, wherein said substrate has a thickness of about 0.3 mm.

6. A substrate for a semiconductor device, comprising:
   a ceramic substrate having a material composition including alumina as a main component, zirconia, and at least one additive selected from the group consisting of yttria, calcia, magnesia, and ceria; and
   thin copper plates directly bonded to front and back surfaces of said ceramic substrate, respectively.

7. The substrate of claim 6, wherein said alumina has a weight proportion that is not less than 70% and less than 100%, said zirconia has a weight proportion that is more than 0% and not more than 30%, and said at least one additive has a total weight proportion of 0.02% to 2%.

8. The substrate of claim 6, wherein material powders of said ceramic components have a particle diameter range of 0.5 μm to 3 μm.

9. The substrate of claim 7, wherein said at least one additive is calcia, and has a weight proportion of 0.02% to 0.5%.

10. The substrate of claim 7, wherein said at least one additive is magnesia, and has a weight proportion of 0.02% to 0.4%.

11. The substrate of claim 7, wherein said at least one additive is ceria, and has a weight proportion of 0.02 to 0.5%.

12. The substrate of claim 7, wherein said at least one additive is at least two additives selected from the group consisting of yttria, calcia, magnesia, and ceria, and said at least two additives have a total proportion of 0.05 mol % to 1.0 mol %.

13. The substrate of claim 7, wherein said at least one additive is yttria, and has a weight proportion of 0.1% to 2%.

14. The substrate of any one of claims 13 to 12, wherein said alumina has a weight proportion of 82% to 97%, and said zirconia has a weight proportion of 2.5% to 17.5%.

* * * * *

UNITED STATES PATENT AND TRADEMARK OFFICE
CERTIFICATE OF CORRECTION

PATENT NO. : 5,675,181
DATED : October 07, 1997
INVENTOR(S) : Masaharu NISHIURA et al.

It is certified that error appears in the above-identified patent and that said Letters Patent is hereby corrected as shown below:

Claim 14, column 14, line 43, "13 to 12" should read --9 to 13--.

Signed and Sealed this

Tenth Day of November 1998

Attest:

BRUCE LEHMAN

Attesting Officer         Commissioner of Patents and Trademarks